(12) United States Patent
Sugimoto (10) Patent No.: US 9,450,116 B2
(45) Date of Patent: Sep. 20, 2016

(54) THIN FILM SOLAR CELL AND MANUFACTURING METHOD THEREFOR

(75) Inventor: Hiroki Sugimoto, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 0 days.

(21) Appl. No.: 14/241,797

(22) PCT Filed: Aug. 23, 2012

(86) PCT No.: PCT/JP2012/071309
§ 371 (c)(1),
(2), (4) Date: Feb. 27, 2014

(87) PCT Pub. No.: WO2013/031635
PCT Pub. Date: Mar. 7, 2013

(65) Prior Publication Data
US 2014/0216543 A1    Aug. 7, 2014

(30) Foreign Application Priority Data

Sep. 2, 2011 (JP) ................................ 2011-191451

(51) Int. Cl.
*H01L 31/0232* (2014.01)
*H01L 31/0224* (2006.01)
(Continued)

(52) U.S. Cl.
CPC . *H01L 31/022441* (2013.01); *H01L 31/02167* (2013.01); *H01L 31/02366* (2013.01); *H01L 31/022425* (2013.01); *H01L 31/03923* (2013.01); *H01L 31/03925* (2013.01); *H01L 31/056* (2014.12); *H01L 31/075* (2013.01); *H01L 31/0749* (2013.01); *Y02E 10/52* (2013.01); *Y02E 10/541* (2013.01); *Y02E 10/543* (2013.01); *Y02E 10/548* (2013.01); *Y02P 70/521* (2015.11)

(58) Field of Classification Search
CPC .............. H01L 31/022441; H01L 31/022425; H01L 31/02366; H01L 31/03923; H01L 31/02167; H01L 31/056; H01L 31/0749; H01L 31/075
USPC ........................................................ 136/256
See application file for complete search history.

(56) References Cited

U.S. PATENT DOCUMENTS

2010/0307570 A1* 12/2010 Aoyama .................... C08J 5/18
136/252

FOREIGN PATENT DOCUMENTS

| EP | 1670065 | 6/2006 |
|---|---|---|
| JP | 1-106472 | 4/1989 |

(Continued)

OTHER PUBLICATIONS

Moulin, E. et al. "Integration of Metallic Nanopartciles in Thin-Film Solar Cells," 21st European Photovoltaic Solar Energy Conference, Sep. 4-8, 2006, Dresden, Germany; 6 pages.

(Continued)

*Primary Examiner* — Jayne Mershon
(74) *Attorney, Agent, or Firm* — Morrison & Foerster LLP (57) ABSTRACT

In the present invention, in order to achieve a point contact, a thin film solar cell has a thin film light absorbing layer (3) disposed between a transparent conducive film (4) and a back-side metal electrode layer (2), and at the interface between the back-side metal electrode layer (2) and the light absorbing layer (3), the thin film solar cell is provided with a nanoparticle dispersion layer (5) including nanoparticles (6, 6 . . . ), where at least the surface of the nanoparticles is an insulator.

16 Claims, 4 Drawing Sheets

(51) Int. Cl.
*H01L 31/0236* (2006.01)
*H01L 31/0392* (2006.01)
*H01L 31/0216* (2014.01)
*H01L 31/056* (2014.01)
*H01L 31/0749* (2012.01)
*H01L 31/075* (2012.01)

(56) References Cited

FOREIGN PATENT DOCUMENTS

| JP | 9-283779 | 10/1997 |
|----|----------|---------|
| JP | 2006-66550 | 3/2006 |
| JP | 2009-246025 | 10/2009 |
| JP | 2010-225798 | 10/2010 |

OTHER PUBLICATIONS

Extended Search Report mailed Mar. 2, 2015, directed to European Application No. 12828604.4, 7 pages.

International Search Report mailed Sep. 18, 2012, directed to International Application No. PCT/JP2012/071309; 1 page.

* cited by examiner

THIN FILM SOLAR CELL AND MANUFACTURING METHOD THEREFOR

REFERENCE TO RELATED APPLICATIONS

This application is the national stage application under 35 USC 371 of International Application No. PCT/JP2012/071309, filed Aug. 23, 2012, which claims the priority of Japanese Patent Application No. 2011-191451, filed Sep. 2, 2011, the entire contents of which are incorporated herein by reference.

TECHNICAL FIELD OF THE INVENTION

The present invention relates to a thin film solar cell and a method of production of the same, in particular, relates to a thin film solar cell which can achieve a high photovoltaic conversion efficiency and a method of production of the same.

BACKGROUND OF THE INVENTION

In recent years, thin film solar cells which use amorphous silicon or chalcogenide-based compounds as materials have come under the spotlight. Such solar cells have the superior properties of being inexpensive in cost of materials and enabling easy production of large-sized solar cell panels. On the other hand, in general, their photovoltaic conversion efficiency is inferior to that of crystal-type solar cell. Much more improvement is desired.

In crystal-type solar cells which use silicon wafers as materials, to further improve their photovoltaic conversion efficiency, it has been proposed and commercially practiced to make the electrode layer a point contact structure. The contact interface between the semiconductor layer and the electrode layer is a part with a high density of dangling bonds and other crystal defects and where the carrier recombination speed is the fastest. Therefore, in the prior art, the light absorption layer (semiconductor layer) and the electrode layer are made to contact each other by point contact to reduce the ratio of surface recombination and improve the photovoltaic conversion efficiency. Specifically, by forming a good quality oxide film or nitride film with a small surface recombination rate which would function as a passivation film at the majority of the interface between the light absorption layer and the electrode layer, point contact would be realized and the ratio of recombination of carriers would be reduced (for example, see PLT 1). Due to this, it is known that the open circuit voltage, which is one of the solar cell characteristics, becomes higher and the photovoltaic conversion efficiency is improved.

However, in current thin film solar cells, the above such point contact structure is not realized. When applying the above art designed for crystal silicon solar cells to, for example, CIS-based thin film solar cells, it is necessary to form an insulation film with few defects between the semiconductor layer and the electrode layer, but the art of forming such an insulation film has not been realized. There is a possibility that it will be realized by future technical innovations, but even in that case, probably the process of production would become complicated and an increase in manufacturing costs would be invited.

Therefore, in a thin film solar cell, if it were possible to realize a point contact structure which is easily formed between the light absorption layer and electrode layer, improvement of the photovoltaic conversion efficiency of the thin film solar cell would be achieved without inviting an increase in the cost of manufacture.

PLT 1: Japanese Patent Publication No. H9-283779A
PLT 2: Japanese Patent Publication No. 2009-246025A

SUMMARY OF THE INVENTION

Therefore, an object of the present invention is to realize a thin film solar cell which is provided with easily formed point contact between the light absorption layer and the electrode layer.

To solve the above problem, in a first aspect of the present invention, there is provided a thin film solar cell comprised of a transparent electrode film and metal back surface electrode layer between which a thin film of a light absorption layer is arranged, which thin film solar cell is characterized in that an interface between the metal back surface electrode layer and the light absorption layer is provided with a nanoparticle dispersed layer which contain nanoparticles with at least surfaces constituted by insulators.

In the first aspect, the nanoparticles may be any of particles with entire parts formed by the insulators, particles with insides which are hollow, or particles comprised of metal particles with surfaces which are covered by the insulators. In this case, the insulators are any of silica, alumina, silicon nitride, or soda lime glass. Further, when the insulators have a refractive index which is smaller than the refractive index of the light absorption layer, the nanoparticles may be made a particle size of 100 nm to 500 nm.

Furthermore, when the nanoparticles are particles comprised of metal particles with surfaces which are covered by the insulators, the nanoparticles may be made a particle size of 100 nm or less. In this case, the metal particles are Au, Ag, or Cu.

Furthermore, the nanoparticle dispersed layer may be formed at the light absorption layer side of the interface between the metal back surface electrode layer and the light absorption layer. Alternatively, the nanoparticle dispersed layer may be formed at the metal back surface electrode layer side of the interface between the metal back surface electrode layer and the light absorption layer.

To solve the problem, in a second aspect of the present invention, there is provided a method of production of a thin film solar cell which is comprised of the steps of forming on a substrate a metal back surface electrode layer, coating and drying a solution which contains nanoparticles with at least surfaces which are insulators on a surface of the metal back surface electrode layer to thereby form on the metal back surface electrode layer a nanoparticle dispersed layer, forming a thin film of a p-type light absorption layer on the metal back surface electrode layer which includes the nanoparticle dispersed layer, and forming on the light absorption layer an n-type transparent electrode film.

In a second aspect, the metal back surface electrode layer may be comprised of Mo, and the p-type light absorption layer may be comprised of a compound semiconductor.

To solve the above problem, according to a third aspect of the present invention, there is provided a method of production of a thin film solar cell which is comprised of the steps of forming on a transparent substrate a transparent electrode film, forming on the transparent electrode film a thin film of a light absorption layer which includes at least one pn junction, coating and drying a solution which contains nanoparticles with at least surfaces of insulators on the surface of the light absorption layer to thereby form on the light absorption layer a nanoparticle dispersed layer, and forming on the light absorption layer which includes the nanoparticle dispersed layer a metal back surface electrode layer.

In the second and third aspects, the nanoparticles may be any of particles with entire parts formed by the insulators, particles with insides which are hollow, or particles comprised of metal particles with surfaces which are covered by the insulators.

Furthermore, when the nanoparticles are particles comprised of metal particles with surfaces which are covered by the insulators, the nanoparticles may be made a particle size of 100 nm or less.

Furthermore, the insulators may be made of any of silica, alumina, silicon nitride, or soda lime glass.

According to the present invention, the interface between the metal back surface electrode layer and the p-type light absorption layer is formed with a nanoparticle dispersed layer which includes nanoparticles with surfaces comprised of insulators. Due to this, the contact area between the metal back surface electrode layer and the p-type light absorption layer is greatly limited and point contact can be realized. Due to this point contact, the recombination speed of the carriers at the interface between the metal back surface electrode layer and the p-type light absorption layer greatly falls and the carriers which are produced by the incident light efficiently reach the electrodes without being recombined, so the thin film solar cell is improved in photovoltaic conversion efficiency. Furthermore, when the insulators of the surfaces of nanoparticles have a refractive index which is smaller than the refractive index of the light absorption layer, the nanoparticles are made a particle size of 100 nm or more to enable the nanoparticle dispersed layer to function as a BSR (back surface reflector) structure and further improve the thin film solar cell in photovoltaic conversion efficiency.

Further, for example, when using nanoparticles which are comprised of gold (Au) or silver (Ag) particles which are covered by an insulation film so as to form the nanoparticle dispersed layer, the nanoparticles are made a particle size of 100 nm or less to enable surface plasmon resonance at the nanoparticle dispersed layer and further improve the thin film solar cell in photovoltaic conversion efficiency.

The nanoparticle dispersed layer can be easily formed by coating and drying a solution which contains the nanoparticles on the metal back surface electrode layer or light absorption layer. Therefore, according to the present invention, it is possible to easily realize point contact at the thin film solar cell.

BRIEF DESCRIPTION OF THE DRAWINGS

FIG. 2(*a*) is a view which shows part of the production process of a CIS-based thin film solar cell which is shown in FIG. 1.

FIG. 2(*b*) is a view which shows a step after the production process which is shown in FIG. 2(*a*).

FIG. 2(*c*) is a view which shows a step after the production process which is shown in FIG. 2(*b*).

FIG. 3(*a*) is a view which shows part of the production process of a CIS-based thin film solar cell which is shown in FIG. 1 and shows a step after the production process which is shown in FIG. 2(*c*).

FIG. 3(*b*) which shows a step after the production process which is shown in FIG. 3(*a*).

DETAILED DESCRIPTION OF THE INVENTION

Below, various embodiments of the present invention will be explained with reference to the drawings. Note that, what are described as schematic views in the following drawings facilitate understanding by showing the relationships among the layers by sizes which are different from the actual ones. Further, in the drawings, the same reference notations show the same or similar component elements.

Figure 1:
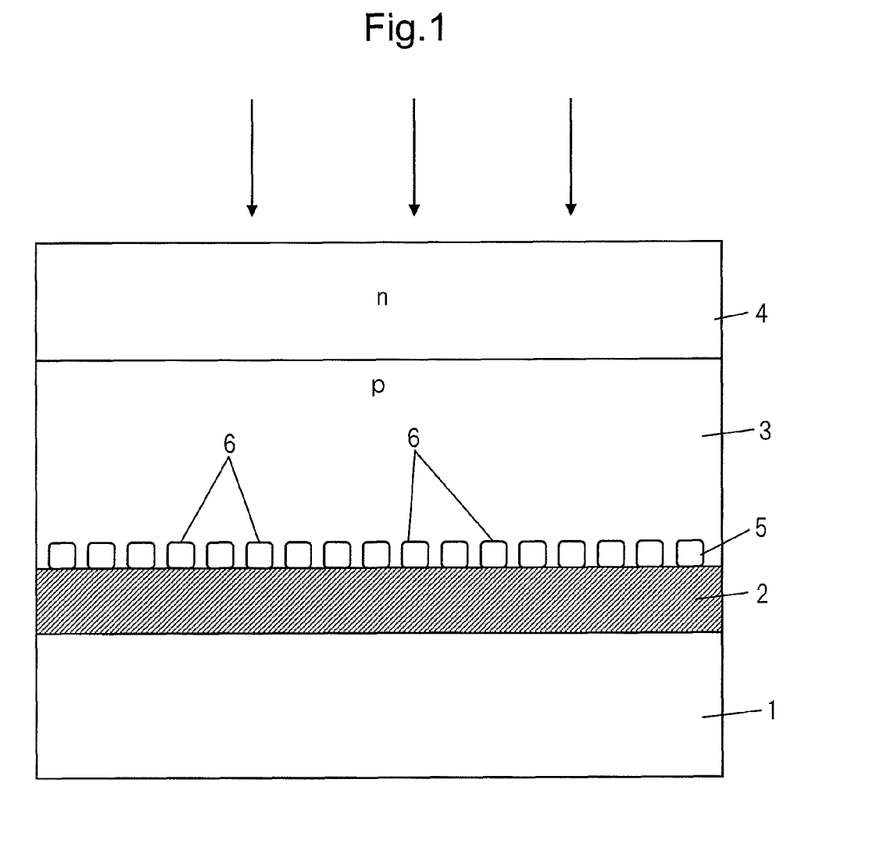
FIG. 1 is a cross-sectional view which shows the general configuration of a CIS-based thin films solar cell according to an Embodiment 1 of the present invention.

FIG. 1 is a cross-sectional view which shows the schematic structure of a thin film solar cell of a substrate structure according to a first embodiment of the present invention, in particular, the structure of a thin film solar cell which uses a CIS-based semiconductor as the p-type light absorption layer. In the figure, 1 indicates a substrate which is comprised of glass, a plastic, a metal sheet, etc., 2 a metal back surface electrode layer which has Mo, Ti, Cr, etc. as a material, 3 a p-type light absorption layer which is comprised of a CIS-based semiconductor, and 4 an n-type transparent electrode film which has ZnO, ITO, etc. as a material. These form the window layer of this solar cell. Note that, between the p-type light absorption layer 3 and the n-type transparent electrode film 4, a high resistance buffer layer which has Zn(O, S, OH), CdS, $In_2S_3$, etc. as its material may be provided. The p-type light absorption layer 3 is comprised of $Cu(In, Ga)Se_2$, $Cu(In, Ga)(Se, S)_2$, $CuInS_2$, etc.

As one example, the metal back surface electrode layer 2 has a thickness of 200 to 500 nm, the p-type light absorption layer 3 has a thickness of 1.0 to 1.5 μm, and the n-type transparent electrode film 4 has a thickness of 0.5 to 2.5 μm.

In FIG. 1, 5 is a nanoparticle dispersed layer which is provided at an interface of the metal back surface electrode layer 2 and the p-type light absorption layer 3 and which is formed by nanoparticles 6, 6 . . . with at least surfaces which are formed by insulators and with 10 nm to 500 nm or so particle sizes which are dispersed on the metal back surface electrode layer 2. The coverage rate of the surface of the metal back surface electrode layer 2 by the nanoparticles 6 at the nanoparticle dispersed layer 5 (interface coverage rate) is made 20% to 95% or so. The nanoparticle dispersed layer 5 is formed by coating the metal back surface electrode layer 2 with a solution which contains the nanoparticles (for example, pure water) and drying the same. The interface coverage rate can be controlled by adjusting the concentration of nanoparticles in the solution.

The p-type light absorption layer 3 is formed after forming the metal back surface electrode layer 2 with the nanoparticle dispersed layer 5. Therefore, the contact area between the metal back surface electrode layer 2 and the p-type light absorption layer 3 is limited by the presence of the nanoparticles 6 at the nanoparticle dispersed layer 5 and becomes remarkably small. Along with this, the surface recombination rate of the carriers at the interface between the p-type light absorption layer 3 and the metal back surface electrode layer 2 also falls. As a result, this structure enables point contact to be realized at the metal back surface electrode side.

Note that, as the insulators which cover the nanoparticles 6 or the insulators which form the nanoparticles 6 themselves, silica ($SiO_2$), alumina ($Al_2O_3$), silicon nitride ($Si_3N_4$), or soda lime glass can be used. These are stable without melting at the heat treatment temperature (500° C. to 700° C.) in the case of forming the CIS-based light absorption layer 3.

As the nanoparticles 6, if necessary, it is possible to use the ones of the Aspect 1 to Aspect 3 which are shown below.

The nanoparticles 6 of the Aspect 1 are nanoparticles which are formed by insulators of a single substance, for example, alumina, silica, SLG (soda lime glass), and silicon nitride, and which give a point contact effect by being made a size of 10 nm to 500 nm or so. As such nanoparticles, commercially available ones may be used (for example, see http://www.sigmaaldrich.com/japan/materialscience/nanomaterials/nanopowders.html).

In the case of the CIS-based thin film solar cell which is shown in FIG. 1, the CIS-based p-type light absorption layer 3 has a refractive index of 3.0 or so. Further, the alumina ($Al_2O_3$), silica ($SiO_2$), and soda lime glass which cover the nanoparticles have refractive indexes of 1.5 or so, while silicon nitride has a refractive index of 2.0 or so, therefore the nanoparticle dispersed layer 5 which is comprised by the nanoparticles of the Aspect 1 are provided with a back surface reflection (BSR) function. To obtain the BSR function effectively, the nanoparticles 6 preferably have a particle size of 100 nm or more.

That is, in the nanoparticles of the Aspect 1, by using ones with a particle size of 100 nm or more, the nanoparticle dispersed layer 5 enables both a point contact effect and back surface reflection effect to be expected and enables the thin film solar cell to be further improved in photovoltaic conversion efficiency.

The nanoparticles 6 of the Aspect 2 is comprised of nanoparticles of a metal (for example, Au, Ag, or Cu) which are covered by alumina, silica, SLG, silicon nitride, etc. to make the particle surface insulators. To obtain the point contact effect, the particle size is made 10 nm to 500 nm or so. By making such nanoparticles a particle size of 100 nm or less (a size sufficiently smaller than the wavelength of the incident light), it is possible to expect the generation of surface plasmon resonance at the visible region at the nanoparticle dispersed layer 5. If causing surface plasmon resonance at the nanoparticle dispersed layer 5, a local large electric field occurs and thereby increases the intensity of the light and generates a large photocurrent. As a result, the absorption efficiency of the light increases and the solar cell is improved in photovoltaic conversion efficiency (see PLT 2, paragraph [0017]). Therefore, by using nanoparticles of the Aspect 2 with a particle size of 100 nm or less to form the nanoparticle dispersed layer 5, it is possible to obtain a point contact effect and surface plasmon effect and further improve the thin film solar cell in photovoltaic conversion efficiency. For the nanoparticles of the Aspect 2 which are comprised of metal particles which are covered by insulators of silica etc. and their surface plasmon resonance, for example, see http://www.chem.tsukuba.ac.jp/teranisi/research/Opt.html.

The nanoparticles 6 of the Aspect 3 are nanoparticles comprised of hollow insulators (for example, alumina, silica, SLG, silicon nitride, etc.) By using such nanoparticles with a particle size of 10 nm to 500 nm to form the nanoparticle dispersed layer 5, it is possible to obtain a point contact effect at the metal electrode layer side. Further, in a CIS-based thin film solar cell or CZTS-based thin film solar cell, by using the nanoparticles of the Aspect 3 with a particle size of 100 nm or more to form the nanoparticle dispersed layer 5, it is possible to obtain both a point contact effect and a back surface reflection effect and possible to further improve the thin film solar cell in photovoltaic conversion efficiency. The nanoparticles of the Aspect 3 are, for example, described in http://www.nittetsukou.co.jp/rdd/tech/tech_silinax.html.

Figure 2A:
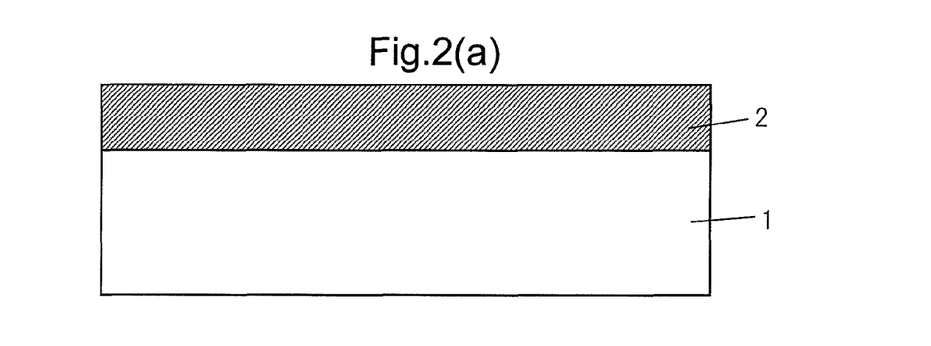
Figure 2B:
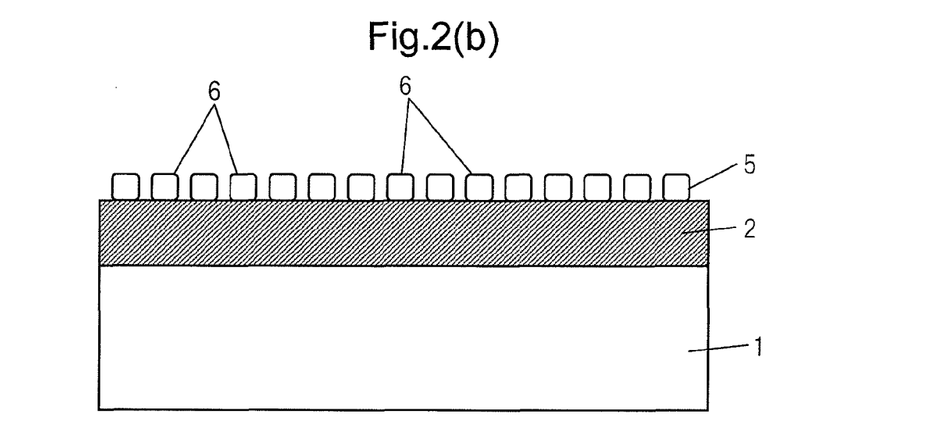
Figure 2C:
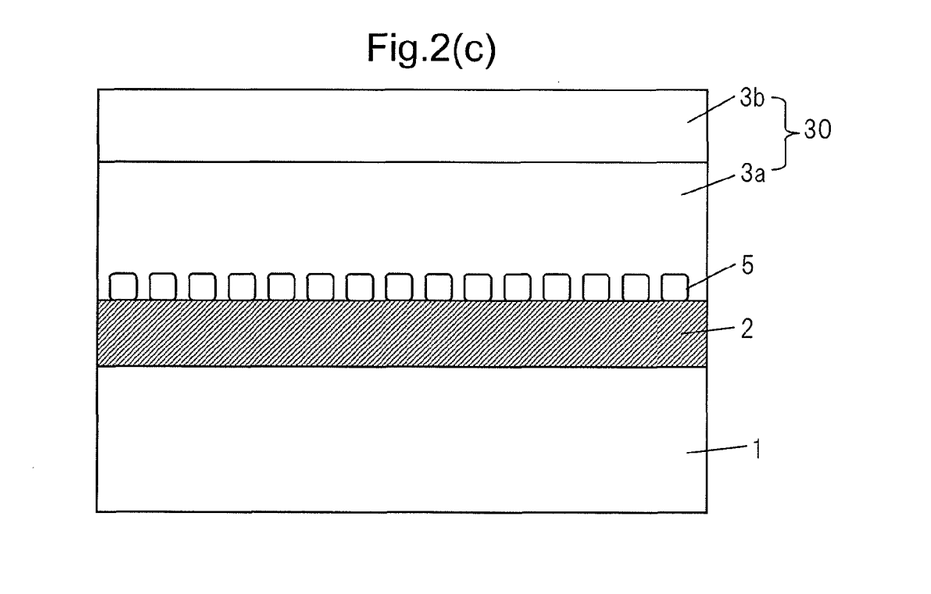
Figure 3A:
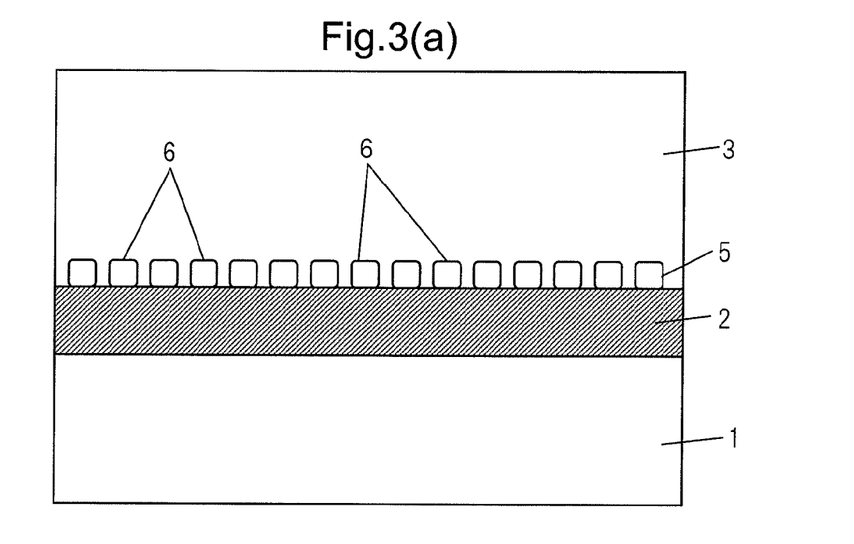
Figure 3B:
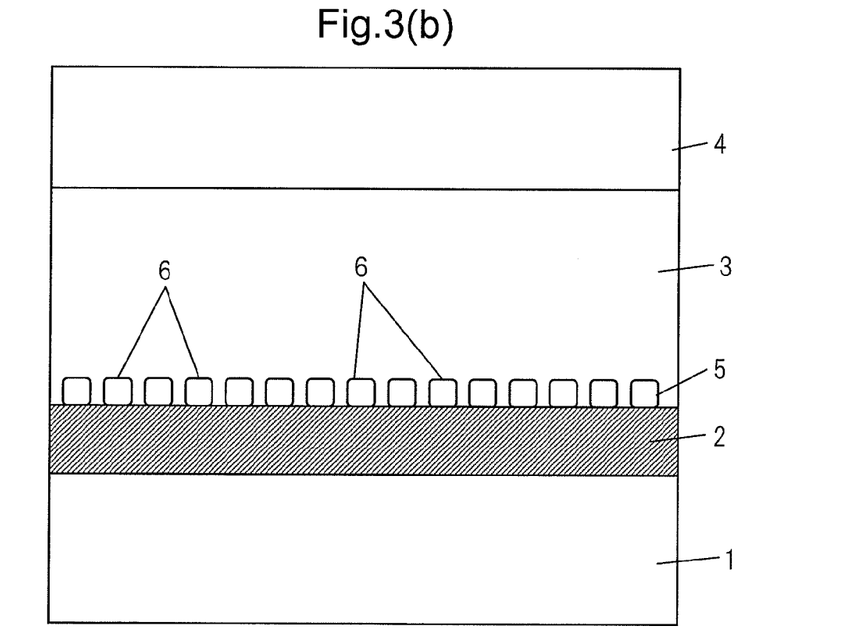

Referring to FIG. 2 and FIG. 3, a method of production of a CIS-based thin film solar cell of the substrate structure which is shown in FIG. 1 will be explained.

As shown in FIG. 2(*a*), first, a glass, plastic, metal sheet, or other substrate 1 is formed with an Mo or other metal back surface electrode layer 2 by DC sputtering etc. The metal back surface electrode layer 2 has a thickness of 200 to 500 nm. The surface of the metal back surface electrode layer 2 is coated and dried with a solution which contains nanoparticles (for example, pure water) so as to form a nanoparticle dispersed layer 5 such as shown in FIG. 2(*b*). The coverage rate of the surface of the metal back surface electrode layer 2 by the nanoparticles 6, 6 . . . in the nanoparticle dispersed layer 5 is 20% to 95%. By control of the concentration of the nanoparticles which are included in the solution, the desired coverage rate can be achieved.

Next, as shown in FIG. 2(*c*), to form a CIS-based p-type light absorption layer 3, first, a CuGa layer 3*a* is deposited by sputtering, then an In layer 3*b* is similarly deposited by sputtering to form a metal precursor film 30. The CuGa layer 3*a* may also be formed using CuGa as the sputter source. Furthermore, the metal precursor film 30 may also be formed by Cu and In without using Ga or may be formed using Cu—Ga—In as the sputter source.

The above formed metal precursor film 30 is next selenized/sulfurized. First, the substrate on which the metal precursor film 30 is formed is placed in a reactor, $H_2Se$ gas which has been diluted by $N_2$ gas etc. is introduced, then the substrate is raised in temperature to 400° C. or so so as to promote the reaction between CuGa, In, and Se. When sulfurizing the metal precursor film 30, after the selenization, the $H_2Se$ gas is changed to diluted $H_2S$ gas to promote sulfurization of the selenide. As a result, as shown in FIG. 3(*a*), a $Cu(In, Ga)Se_2$, $Cu(In, Ga)(Se, S)_2$, or other p-type light absorption layer 3 is formed on the nanoparticle dispersed layer 5 and metal back surface electrode layer 2. The CIS-based p-type light absorption layer 3 has a thickness of generally 1.0 to 1.5 μm.

Note that, in the formed CIS-based thin film solar cell, to obtain a high photovoltaic conversion efficiency, the CIS-based p-type light absorption layer 3 has to include Na or another alkali metal. Therefore, at the time of formation of the metal precursor film, Na has to be mixed into the sputter material or Na has to be added to the metal precursor film after forming it.

Alternatively, it is also possible to form the substrate 1 by SLG (soda lime glass) so as to supply Na from the substrate 1 to the p-type light absorption layer 3. Furthermore, when forming the nanoparticles 6 by SLG, the nanoparticles 6 also become sources of supply of Na to the p-type light absorption layer 3.

Next, as shown in FIG. 3(*b*), an n-type transparent electrode film 4 which has ZnO, ITO, etc. as a material is formed by sputtering etc. on the CIS-based p-type light absorption layer 3 to form a window layer. Note that, between the CIS-based p-type light absorption layer 3 and the n-type transparent electrode film 4, it is also possible to provide a high resistance buffer layer which has Zn(O, S, OH), CdS, $In_2S_3$, etc. as a material. The n-type transparent electrode film 4 has a thickness of generally 0.5 to 2.5 μm.

Note that, the thin film solar cell which is explained with reference to FIG. 2 and FIG. 3 has the p-type light absorption layer 3 formed by a CIS-based semiconductor, but it may also be formed by a CZTS-based semiconductor. CZTS is a Group $I_2$-II-IV-$VI_4$ compound semiconductor which includes Cu, Zn, Sn, and S. As typical ones, there are $Cu_2ZnSnS_4$ etc. Furthermore, a CdTe or other Group II-VI compound semiconductor can be used to form the light absorption layer.

In the thin film solar cell of the substrate structure which is shown in the above Embodiment 1 (structure comprised of substrate on which a metal back surface electrode layer, light absorption layer, and transparent electrode film are successively stacked), the metal back surface electrode is formed with a dispersed layer of nanoparticles and a p-type light absorption layer and transparent electrode film are successively formed on top of that, so the p-type light absorption layer is formed with a nanoparticle dispersed layer which has surface relief as an underlayer. For this reason, the surface of the p-type light absorption layer which is formed is affected by the surface of the underlying nanoparticle dispersed layer and is similarly formed with relief shapes. Due to the relief shapes, the ratio of the light which is incident from the light receiving surface side and passes through the transparent electrode film and which is then reflected at the p-type light absorption layer surface and emitted again to the outside is reduced, so more light reaches the inside of the p-type light absorption layer. As a result, the thin film solar cell is further improved in power generation efficiency.

Figure 4:
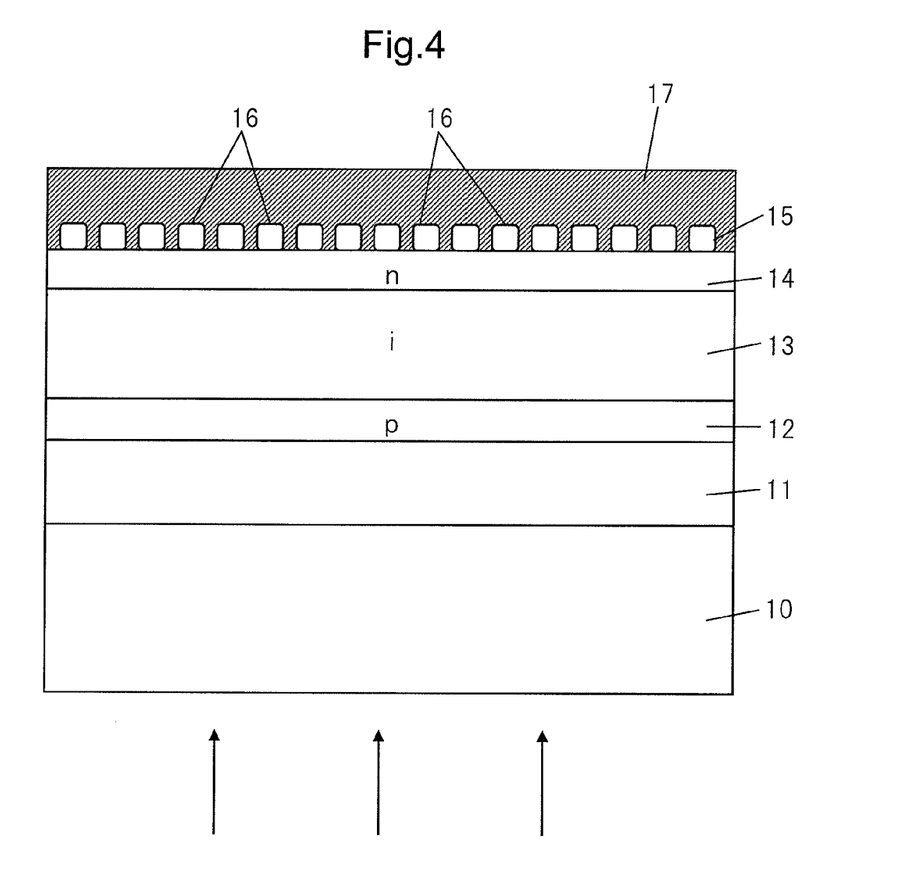
FIG. 4 is a view which shows the general configuration of an amorphous silicon thin film solar cell according to an Embodiment 2 of the present invention.

FIG. 4 is a cross-sectional view which shows the schematic structure of a super straight structure of a thin film solar cell according to an Embodiment 2 of the present invention and, in particular, shows the structure of a thin film solar cell which is comprised of amorphous silicon. In FIG. 4, 10 indicates a glass or other transparent substrate, 11 an ITO or other transparent electrode film, 12 a p-type amorphous silicon layer, 13 an i-type amorphous silicon layer, and 14 an n-type amorphous silicon layer. The transparent electrode film 11 is formed on the substrate by forming an ITO film by sputtering etc. The p-type amorphous silicon layer 12, i-type amorphous silicon layer 13, and n-type amorphous silicon layer 14 configure a light absorption layer and are formed by forming p-, i-, and n-types of amorphous silicon by plasma CVD etc. on the transparent electrode film 11.

Reference notation 15 shows a nanoparticle dispersed layer which is formed on the n-type amorphous silicon layer 14. The layer 15 is formed by coating the n-type amorphous silicon layer 14 with a solution which contains the nanoparticles 16, 16 . . . (for example, pure water) and drying it. The interface coverage rate is suitably 20% to 95%. By adjusting the concentration of particles in the solution, the coverage rate can be controlled. If a nanoparticle dispersed layer 15 is formed, Ag or Al etc. is sputtered on this to form a metal back surface electrode layer 17 and complete an amorphous silicon thin film solar cell.

In the super straight structure of a thin film solar cell of FIG. 4, the incident light enters from the substrate 10 side to pass through the transparent electrode film 11 and strike the p-i-n light absorption layer.

The nanoparticles 16, 16 . . . of the present embodiment can take the Aspect 1, Aspect 2, and Aspect 3 in the same way as the nanoparticles 6, 6 . . . of the Embodiment 1. However, with a super straight structure, Au, Al, or another light reflecting metal is used to form the metal back surface electrode layer 17, so the electrode layer 17 itself has a back surface reflection function. For this reason, to obtain a back surface reflection function like in the first embodiment, there is no need to make the nanoparticles 16, 16 . . . a particle size of 100 nm or more.

In the thin film solar cell according to the Embodiment 2, as shown in FIG. 4, the nanoparticle dispersed layer 15 is formed at the metal back surface electrode layer 17 side of the interface of the p-i-n light absorption layer and the metal back surface electrode layer 17, so the contact area between the p-i-n light absorption layer and metal back surface electrode layer 17 is greatly reduced and, as a result, in the same way as the case of the thin film solar cell according to the first embodiment, point contact is formed at the interface. Due to this, the thin film solar cell is greatly improved in photovoltaic conversion efficiency. Further, by using the nanoparticles of the Aspect 2 with a particle size of 100 nm or less so as to form the nanoparticle dispersed layer 15, surface plasmon resonance occurs at the interface, the absorption of the incident light increases, and a high photovoltaic conversion efficiency can be obtained.

Note that, in both of Embodiment 1 and Embodiment 2, the effect of surface plasmon resonance on the photovoltaic conversion efficiency of the solar cell is described in PLT 2, in particular paragraph [0017].

Still furthermore, in Embodiment 1, a p-type light absorption layer 3 constituted by a semiconductor layer which is comprised of a Group I-III-$VI_2$ compound is used, but the present invention is not limited to such a thin film solar cell. For example, in a thin film solar cell which is made by a CdTe or other Group II-VI compound semiconductor etc., by forming a nanoparticle dispersed layer which is similar to the above Embodiment 1 between the light absorption layer and the metal back surface electrode layer, it is possible to realize point contact at the metal back surface electrode layer side and improve the open circuit voltage. Furthermore, in Embodiment 2, as the light absorption layer, an amorphous silicon p-i-n structure is shown, but instead of amorphous silicon, microcrystalline silicon may also be used and a p-n structure which is comprised of a CdTe or CdS or other Group II-VI compound semiconductor may be used.

The invention claimed is:

1. A thin film solar cell comprised of a transparent electrode film and metal back surface electrode layer between which a thin film of a light absorption layer is arranged, which thin film solar cell is characterized in that an interface between said metal back surface electrode layer and said light absorption layer is provided with a nanoparticle dispersed layer which contain nanoparticles with at least surfaces constituted by insulators.

2. The thin film solar cell according to claim 1, wherein said nanoparticles are any of particles with entire parts formed by said insulators, particles with insides which are hollow, or particles comprised of metal particles with surfaces which are covered by said insulators.

3. The thin film solar cell according to claim 2, wherein said insulators are silica, alumina, silicon nitride, or soda lime glass.

4. The thin film solar cell according to claim 2, wherein when said insulators have a refractive index which is smaller than the refractive index of said light absorption layer, said nanoparticles are made a particle size of 100 nm to 500 nm.

5. The thin film solar cell according to claim 2, wherein when said nanoparticles are particles comprised of metal particles with surfaces which are covered by said insulators, said nanoparticles are made a particle size of 100 nm or less.

6. The thin film solar cell according to claim 5, wherein said metal particles are Au, Ag, or Cu.

7. The thin film solar cell according to claim 1, wherein said nanoparticle dispersed layer is formed at said light absorption layer side of the interface between said metal back surface electrode layer and said light absorption layer.

8. The thin film solar cell according to claim 1, wherein said nanoparticle dispersed layer is formed at said metal back surface electrode layer side of the interface between said metal back surface electrode layer and said light absorption layer.

9. A method of production of a thin film solar cell which is comprised of the steps of:
 forming on a substrate a metal back surface electrode layer;
 coating and drying a solution which contains nanoparticles with at least surfaces which are insulators on a surface of said metal back surface electrode layer to thereby form on said metal back surface electrode layer a nanoparticle dispersed layer;
 forming a thin film of a p-type light absorption layer on said metal back surface electrode layer which includes said nanoparticle dispersed layer; and
 forming on said light absorption layer an n-type transparent electrode film.

10. The method of production of a thin film solar cell according to claim 9, in which method of production, said metal back surface electrode layer is comprised of Mo, and said p-type light absorption layer is comprised of a compound semiconductor.

11. The method of production of a thin film solar cell according to claim 9, in which method of production, said nanoparticles are any of particles with entire parts formed by said insulators, particles with insides which are hollow, or particles comprised of metal particles with surfaces which are covered by said insulators.

12. The method of production of a thin film solar cell according to claim 9, in which method of production, said insulators are any of silica, alumina, silicon nitride, or soda lime glass.

13. A method of production of a thin film solar cell which is comprised of the steps of:
 forming on a transparent substrate a transparent electrode film;
 forming on said transparent electrode film a thin film of a light absorption layer which includes at least a pn junction;
 coating and drying a solution which contains nanoparticles with at least surfaces of insulators on the surface of said light absorption layer to thereby form on said light absorption layer a nanoparticle dispersed layer; and
 forming on said light absorption layer which includes said nanoparticle dispersed layer a metal back surface electrode layer.

14. The method of production of a thin film solar cell according to claim 13, in which method of production, when said nanoparticles are particles comprised of metal particles with surface which are covered by said insulators, said nanoparticles are made a particle size of 100 nm or less.

15. The method of production of a thin film solar cell according to claim 13, in which method of production, said nanoparticles are any of particles with entire parts formed by said insulators, particles with insides which are hollow, or particles comprised of metal particles with surfaces which are covered by said insulators.

16. The method of production of a thin film solar cell according to claim 13, in which method of production, said insulator is any of silica, alumina, silicon nitride, or soda lime glass.

* * * * *

UNITED STATES PATENT AND TRADEMARK OFFICE
CERTIFICATE OF CORRECTION

PATENT NO. : 9,450,116 B2  
APPLICATION NO. : 14/241797  
DATED : September 20, 2016  
INVENTOR(S) : Hiroki Sugimoto Page 1 of 1

It is certified that error appears in the above-identified patent and that said Letters Patent is hereby corrected as shown below:

On the Title Page

Item (73) Assignee:
Delete "Showa Shell Sekiyu K.K." and insert --Solar Frontier K.K.--.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*